(12) United States Patent
Schmidt

(10) Patent No.: US 8,861,184 B2
(45) Date of Patent: Oct. 14, 2014

(54) METHOD FOR FABRICATING A MULTI-LAYER CAPACITOR AND A MULTI-LAYER CAPACITOR

(75) Inventor: Oliver G. Schmidt, Dresden (DE)

(73) Assignee: Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 209 days.

(21) Appl. No.: 13/397,287

(22) Filed: Feb. 15, 2012

(65) Prior Publication Data

US 2012/0140379 A1 Jun. 7, 2012

Related U.S. Application Data

(62) Division of application No. 12/187,316, filed on Aug. 6, 2008, now Pat. No. 8,136,213.

(30) Foreign Application Priority Data

Aug. 7, 2007 (EP) .................................. 07015541

(51) Int. Cl.
*H01G 4/32* (2006.01)
*H01G 4/04* (2006.01)
*H01G 4/30* (2006.01)
*B81C 1/00* (2006.01)

(52) U.S. Cl.
CPC . *H01G 4/32* (2013.01); *H01G 4/30* (2013.01); *B81C 1/0019* (2013.01); *B81B 2201/038* (2013.01)
USPC .......................................... 361/511; 361/530

(58) Field of Classification Search
USPC ......................................... 361/511, 530, 301.5
See application file for complete search history.

(56) References Cited

U.S. PATENT DOCUMENTS

| 4,985,103 | A | 1/1991 | Kouno et al. |
| 5,894,402 | A * | 4/1999 | Strange et al. ................. 361/514 |
| 6,229,684 | B1 | 5/2001 | Cowen et al. |
| 6,236,491 | B1 | 5/2001 | Goodwin-Johansson et al. |
| 6,275,325 | B1 | 8/2001 | Sinclair |
| 6,456,420 | B1 | 9/2002 | Goodwin-Johansson |
| 7,707,714 | B2 | 5/2010 | Schmidt et al. |
| 2005/0118733 | A1 | 6/2005 | Schmidt et al. |

FOREIGN PATENT DOCUMENTS

DE  101 59 415 A1  6/2003

OTHER PUBLICATIONS

Schmidt, Thin solid films roll up into nanotubes; Nature, Mar. 8, 2001, p. 168, vol. 410, 2001 Macmillan Magazines Ltd.

* cited by examiner

*Primary Examiner* — Eric Thomas
(74) *Attorney, Agent, or Firm* — Christie, Parker & Hale, LLP

(57) ABSTRACT

The method comprises fabricating a layer stack on a substrate, the layer stack comprising at least two electrically conducting layers and at least one electrically insulating layer arranged between the two electrically conducting layers, and displacing a first portion of the layer stack away from its original position, the first portion comprising an edge portion of the layer stack, and bending the first portion back towards a second portion of the layer stack. The bending may comprise a rolling-up of the first portion of the layer stack.

9 Claims, 5 Drawing Sheets

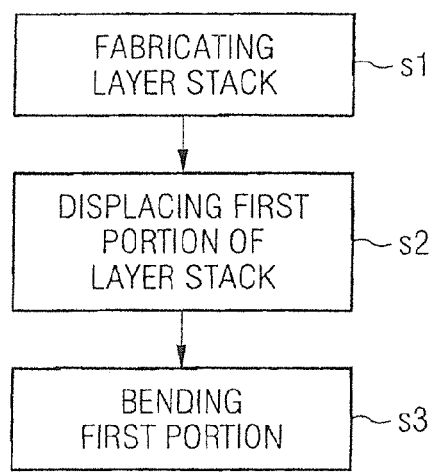
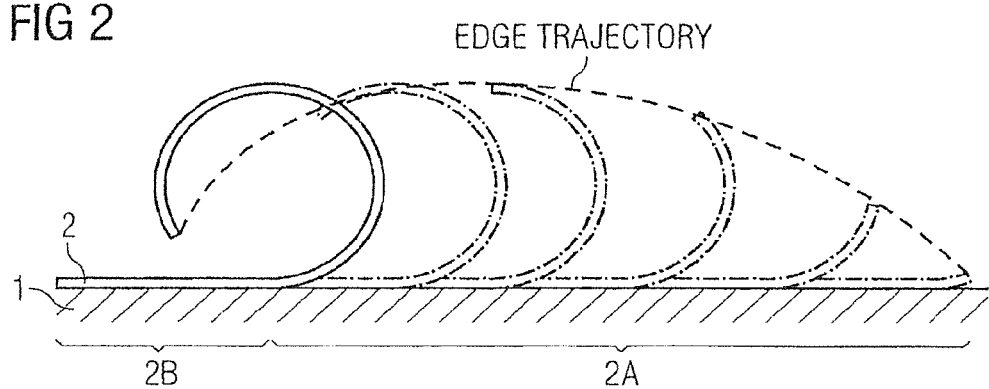

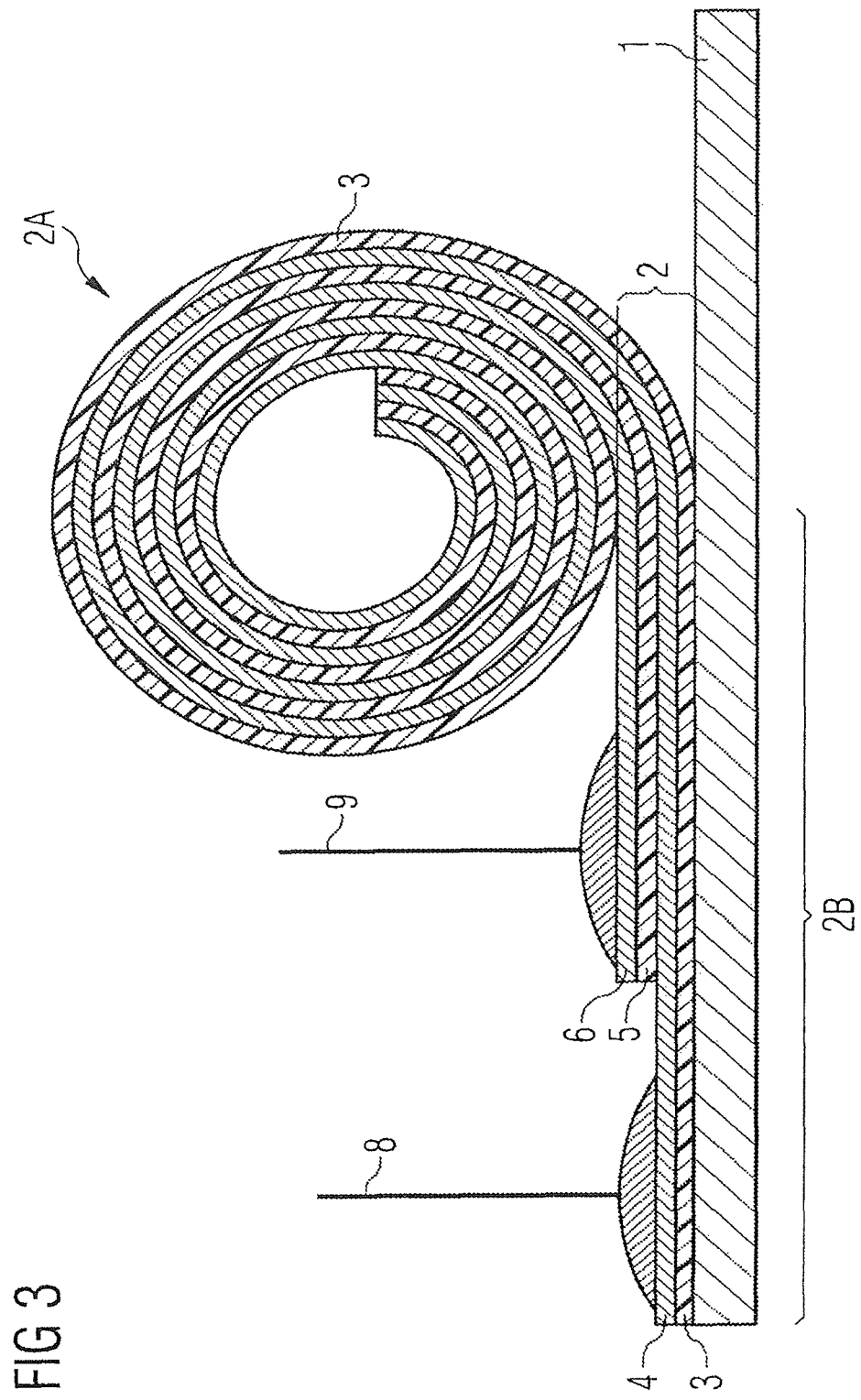

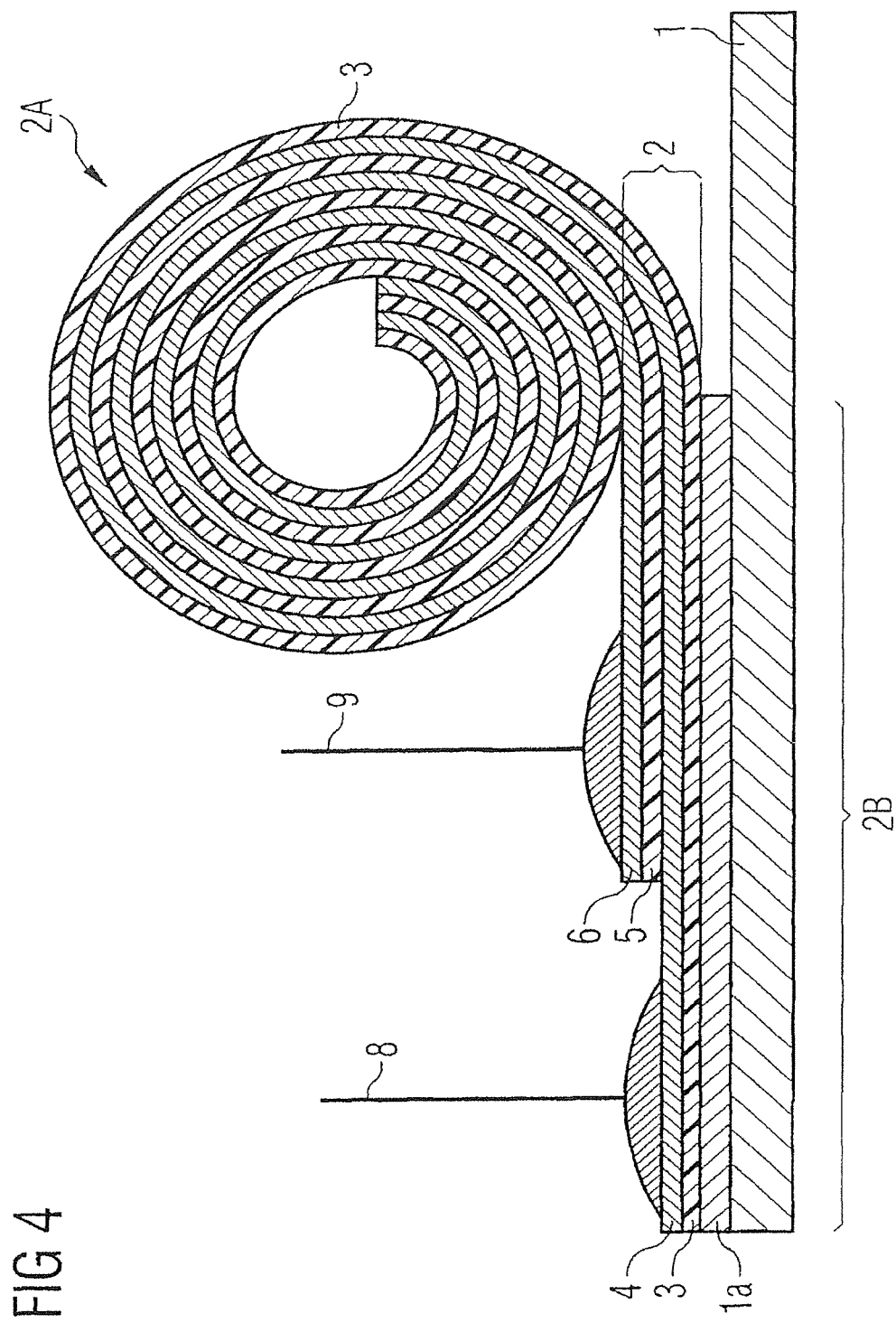

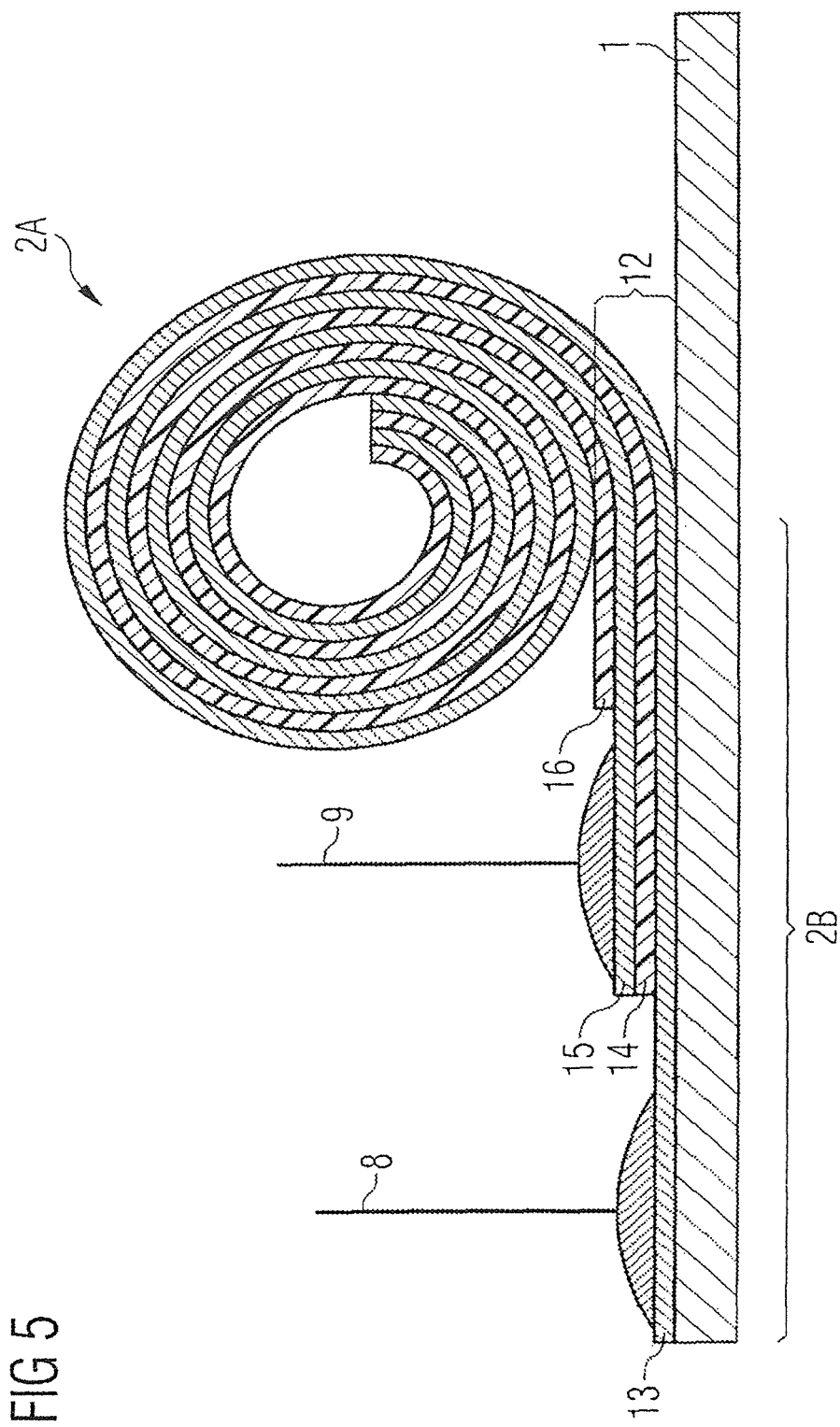

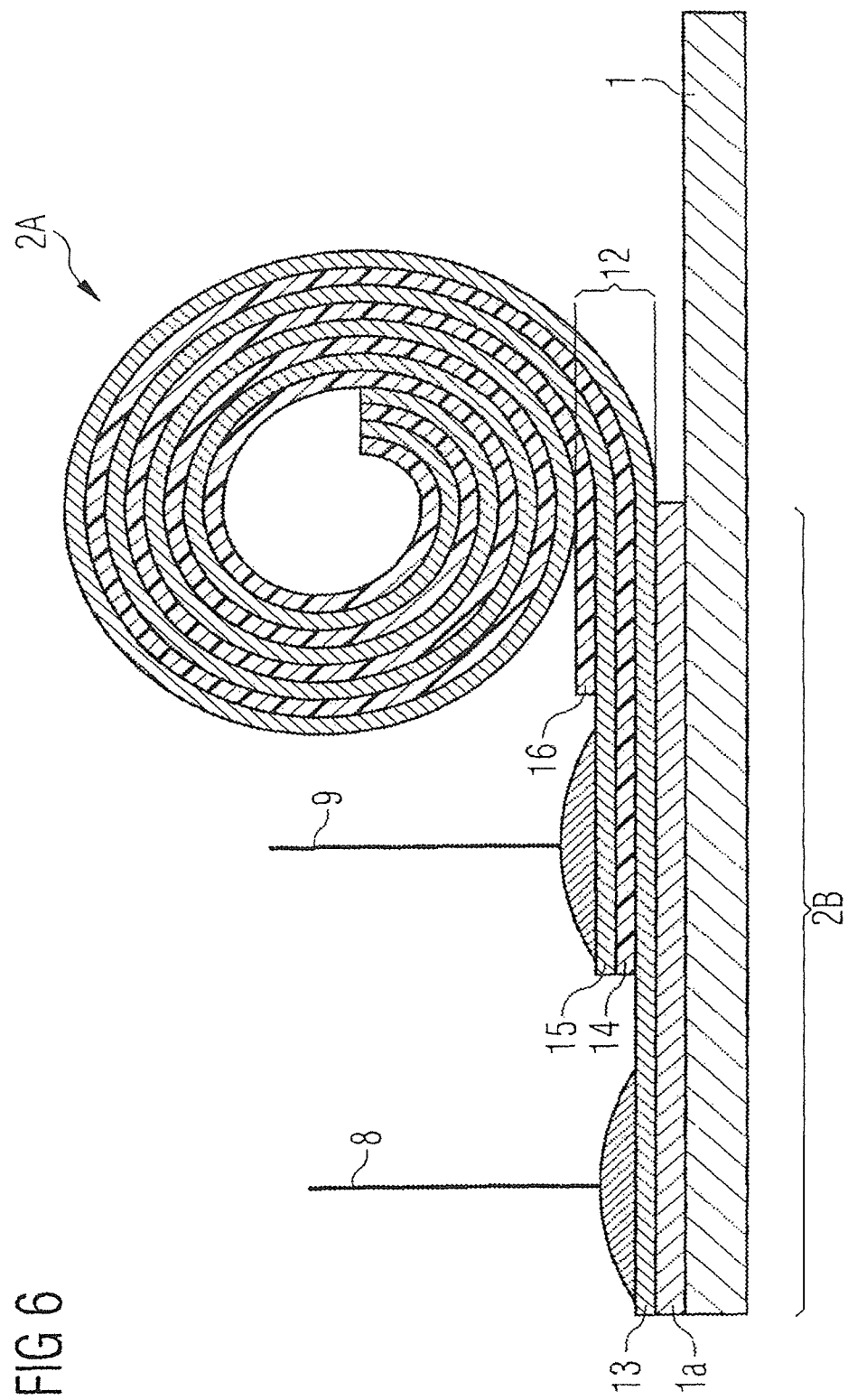

METHOD FOR FABRICATING A MULTI-LAYER CAPACITOR AND A MULTI-LAYER CAPACITOR

CROSS-REFERENCE TO RELATED APPLICATION

This application is a divisional application of allowed U.S. patent application Ser. No. 12/187,316, filed Aug. 6, 2008, which claims priority to and the benefit of European Patent Application No. 07 015 541.1, filed on Aug. 7, 2007, the entire content of which is incorporated herein by reference.

DESCRIPTION

The present invention relates in general to the field of the production of electrical components. In particular, the present invention relates to a method for fabricating a capacitor and to a capacitor according to the independent claims.

For many applications it is necessary to fabricate capacitors having suitable capacitance and to combine them with electronic circuits and/or to utilize them for storing electrical energy or other purposes. These capacitors can nowadays be fabricated as three-dimensional capacitors directly onto any surfaces like, for example, surfaces of finished processed electronic components. The methods known up-to-date, however, lead either to relatively space-consuming capacitors or to capacitors the capacitance of which is too low.

In document DE 101 59 415 A1 a method for producing a micro-capacitor is described in which a section of an auxiliary layer is removed from a substrate and a first conductor layer previously applied to the auxiliary layer is concomitantly taken in the process, and a second conductor layer either is likewise previously applied to the auxiliary layer and remains stationary during the removal or is likewise concomitantly taken, or is applied to the removed section of the auxiliary layer after the removal operation, so that capacitor electrodes are formed by the first and the second conductor layer. This document also describes a micro-capacitor having an essentially cylindrical body, which is formed in that an auxiliary layer with two conductor layers deposited thereon is rolled-up spirally in one or more turns in such a way that the conductor layers are formed as capacitors electrodes.

It is therefore an object of the present invention to specify a method for fabricating a capacitor, which method has improved characteristics as compared with previous fabrication methods. It is a further object of the present invention to specify a capacitor which has improved characteristics as compared with previous fabricated capacitors, in particular occupies a small spatial volume and at the same time provides high capacitance values.

These objects are achieved by means of the features of the independent patent claims. Advantageous refinements and developments are specified in the sub-claims.

According to a first aspect of the present invention there is provided a method for fabricating a capacitor, comprising fabricating a layer stack on a substrate, the layer stack comprising at least two electrically conducting layers and at least one electrically insulating layer arranged between the two electrically conducting layers, and displacing a first portion of the layer stack away from its original position, the first portion comprising an edge portion of the layer stack, and bending the first portion back towards a second portion of the layer stack.

The fabrication of the layer stack on a substrate can be carried out by available deposition techniques or by a simple transfer of thin layers onto a substrate.

The method may be conducted in a way that the bending of the first portion of the layer stack is in fact a rolling-up of the first portion. In this case it will be advantageous if the layer stack comprises an alternate sequence of a particular number of electrically conducting layers and an equal number of electrically insulating layers.

The displacing and the bending and/or rolling of the first portion of the layer stack can be effected by different mechanisms. According to one embodiment it can be effected by simply releasing the first portion from the substrate. According to this embodiment at least one of the electrically conducting layers or the electrically insulating layers of the layer stack can be formed as a stress-graded layer comprising an internal vertical stress profile across the layer or across the layer stack. For preventing the rolling-up of the layer stack during deposition there can be provided a sacrificial layer between the substrate and the layer stack for fixing the layer stack during deposition. A sacrificial layer can be introduced between the substrate and the layer stack. For initiating the bending or rolling process of the layer stack a portion of the sacrificial layer underneath the first portion of the layer stack can be removed, for example by selective etching.

The stress-graded layer may, for example, comprise an internal vertical stress profile wherein the layer is compressively stressed near a first main surface thereof and tensile stressed near a second main surface thereof, wherein the second main surface lies opposite to the first main surface of the stress-graded layer.

The stress gradient may cause either a bending up of the layer stack away from the substrate surface or a bending down of the layer stack towards the substrate surface.

According to a further embodiment the layers of the layer stack do not comprise an internal stress in the as-grown state but instead an internal or external stress is introduced after deposition of the layer stack. For example, a lower part of the layer stack being fabricated out of an appropriate material may be oxidized under an appropriate atmosphere so that this lower part tends to expand and thus to roll-up the whole layer stack due to its own expansion. Alternatively, the lower part can be treated in such a way that the lower part of the layer stack shrinks in size so that the layer stack bends and rolls up towards the surface or the upper part of the layer stack is treated in such a way that the upper part of the layer stack expands and the layer stack bends and rolls up towards the surface.

According to a further embodiment a lower part of the layer stack comprises a hydrogel wherein after deposition of the layer stack the lower part is brought into contact with water so that it draws up and absorbs the water. As a consequence the lower part due to the sucked up water expands and thus rolls up the whole layer stack due to its own expansion.

According to a further embodiment a sacrificial layer is deposited on the substrate before fabricating the layer stack, and a portion of the sacrificial layer underneath the first portion of the layer stack is removed thereby allowing the first portion of the layer stack to lift off and away from the substrate.

One important advantage of the inventive method is that it allows a massive parallel fabrication of multiple capacitors. The capacitors are not necessarily of micro- or nanometer size. They can also have a size in the millimeter range.

According to a second aspect of the present invention there is provided a capacitor comprising a layer stack comprising at least two electrically conducting layers and at least one electrically insulating layer arranged between the two electrically conducting layers, wherein a first portion of the layer stack is bent around an axis in the plane of the layers and a second portion of the layer stack is planar. The capacitor according to the second aspect may be fabricated by to the method according to the first aspect.

According to one embodiment the layer stack comprises at least two electrically conducting layers and at least two electrically insulating layers deposited upon one another in an alternate sequence.

According to a further embodiment the first portion is rolled-up, in particular rolled-up several times. The first portion may thus comprise a roll with several windings of the layer stack.

According to a further embodiment at least part of the electrically conducting layers comprises a metal.

According to a further embodiment at least part of the electrically insulating layers comprises a dielectric material.

According to a further embodiment at least part of the space between the at least two electrically conducting layers is filled with at least one electrolyte.

According to a further embodiment the capacitor further comprises a substrate wherein the second portion of the layer stack is connected to the substrate. The capacitor may further comprise an intermediate layer between the substrate and the layer stack. The intermediate layer may be a sacrificial layer removed during the fabrication of the capacitor.

The capacitor according to the present invention or the capacitor fabricated according to the present invention can, for example, be utilized as part of an electronic circuit like, for example, as the capacitor C of an LC circuit, or it can be utilized as a battery for storing electrical energy, or it can act as a super- or ultracapacitor and provide sufficiently large short-term energy on a chip during any power failure, or it can generate short power pulses or low-power support of critical memory systems. An ultracapacitor in conjunction with a battery can combine the power performance of the former with the greater energy storage capability of the latter.

There may be even further applications.

The invention is explained in more detail below using exemplary embodiments in conjunction with the accompanying drawings, in which:

FIG. 1 shows a flow diagram of the method for fabricating a capacitor;

FIG. 2 illustrates the bending process of the first portion of the layer stack;

FIG. 3 shows a schematic representation of an embodiment of a capacitor in a cross-section;

FIG. 4 shows a schematic representation of a further embodiment of a capacitor in a cross-section;

FIG. 5 shows a schematic representation of a further embodiment of a capacitor in a cross-section; and FIG. 6 shows a schematic representation of a further embodiment of a capacitor in a cross-section.

The aspects and embodiments of the invention are now described with reference to the drawings, wherein like reference numerals are generally utilized to refer to like elements throughout. In the following description, for purposes of explanation, specific details are set forth in order to provide a thorough understanding of one or more aspects of embodiments of the invention. It may be evident, however, to one skilled in the art that one or more aspects of the embodiments of the invention may be practiced with a lesser degree of the specific details. The following description is therefore not to be taken in a limiting sense, and the scope of the invention is defined by the appended claims.

Referring to FIG. 1, there is depicted a flow diagram of a method for fabricating a capacitor. In a step s1 a layer stack is fabricated on a substrate. The layer stack comprises at least two electrically conducting layers and at least one electrically insulating layer arranged between the two electrically conducting layers. The electrically conducting layers are supposed to function as electrode layers of the capacitor to be fabricated and the electrically insulating layer is supposed to function as a separation layer electrically separating the electrically conducting layers from each other. The electrically conducting layers can, for example, be made of a metal like an element metal or an alloy metal. The electrically conducting layers can also be made of a semiconductor or semiconductor compound wherein the material of the semiconductor or the semiconductor compound comprises a doping concentration which is high enough and appropriate in order to function as an electrode layer. The electrically insulating layer can be made of any kind of insulating material like, for example, dielectric material or semiconductor oxide or metal oxide or silicon nitride etc. As an example, the electrically insulating layer can be fabricated by oxidizing a deposited electrically conducting layer so that an oxide layer is formed at a surface region of a deposited electrically conducting layer. Part of the space between the electrically conducting layers can be filled with an electrolyte, as commonly used in batteries, ultra- or supercapacitor cells.

The subsequent steps s2 and s3 are also illustrated schematically in FIG. 2.

In a step s2 of the method a first portion of the layer stack is lifted off and away from the substrate, wherein the first portion comprises an edge portion of the layer stack. The lifting procedure can be performed in such a way that a portion of a sacrificial layer underneath the first portion of the layer stack is removed, for example, by etching. Furthermore, one or more of the layers of the layer stack may comprise an internal vertical stress profile such that the whole layer stack moves upwards as soon as it is released from the substrate. In a further embodiment no sacrificial layer is used but instead the adhesion between the layer stack and the substrate is sufficiently low so that the layer stack can be released from the substrate if, for example, a lower-most layer of the layer stack expands its volume. Such a volume expansion may be caused by an oxidation of the lower-most layer or layers of the layer stack or, alternatively, by using a water-absorbing substance like hydrogel as part of the lower part of the layer stack and supplying water to the lower part of the layer stack, or by any kind of heat treatment due to different expansion coefficients of the different materials.

Step s3 of the method for fabricating a capacitor comprises bending the first portion of the layer stack back towards a second stationary portion of the layer stack. The bending can be, for example, such that the first portion of the layer stack is rolled-up in itself.

It should be noted that step s2 of lifting the first portion and step s3 of bending the first portion can be conducted more or less in parallel during one and the same period of time. In each instance of this period of time increment portions of the first portion are lifted off the substrate and immediately thereupon bent back towards the second portion of the layer stack.

Referring to FIG. 2, there is depicted a dynamic illustration of the method for fabricating a capacitor. FIG. 2 shows a schematic cross-section of an embodiment of the capacitor in different stages of its fabrication from right to left. On a substrate 1 a layer stack 2 is deposited which comprises at least two electrically conducting layers and at least one electrically insulating layer. The layer stack 2 is divided into a first portion 2A and a second portion 2B. The first portion 2A is supposed to be lifted off and away from the substrate 1 and bent back towards the second portion 2B. The second portion 2B is supposed to be stationary. At the beginning of the process the first portion 2A is depicted with the chain-dotted line and is almost completely adhered to the substrate 1, although a small edge portion of the first portion 2A is already lifted off. In the subsequent stages the first portion 2A which is shown with the chain-dotted line is step-by-step lifted off and away from the substrate 1 and bent back towards the second stationary portion 2B. There is also shown with the dashed line the trajectory of the edge portion in the course of the process. On the left side of FIG. 2 there is shown the capacitor drawn with a continuous line. It may be the case that the capacitor fabricated as shown there is in its end position. However, it is also possible that the first portion 2A may be bent even further so that it is rolled-up in itself as will be shown in the following embodiments.

Referring to FIG. 3, there is shown a schematic representation of an embodiment of a capacitor in a cross-section. The layer stack 2 deposited on the substrate 1 consists of a first electrically insulating layer 3, a first electrically conducting layer 4, a second electrically insulating layer 5, and a second electrically conducting layer 6. The layer stack 2 is further divided into a first portion 2A and a second portion 2B. The first portion 2A is rolled-up wherein it can be seen in the Figure that the layer stack of the first portion 2A is rolled-up to more than two revolutions thus containing more than two windings. The second portion 2B of the layer stack 2 is kept stationary during the rolling-up process. The first electrically conducting layer 4 functions as a lower electrode of the capacitor and the second electrically conducting layer 6 functions as an upper electrode of the capacitor. On the left side of the layer stack 2 the second insulating layer 5 and the second conducting layer 6 are etched away so that the first conducting layer 4 can be contacted by a metal contact terminal 8. A further metal contact terminal 9 is used to contact the second conducting layer 6 which is exposed in a portion of the second stationary portion 2B of the layer stack 2.

The roll-up process may be driven by stress gradients that exist somewhere in the layer stack 2 during the release of the layer stack 2 from the substrate 1. For example, the electrically conducting layers might be deposited as metal layers containing a vertical stress gradient. The stress gradient can also be generated in the insulating layers or across part or all of the layer stack. It is also possible to use semiconductor layers with an internal stress profile. Such an internal vertical stress profile may be produced by using two or more semiconductor layers which have lattice constants that decrease from one main surface to the opposing main surface of the semiconductor layers.

In a further embodiment the lower-most layer or layers of the layers stack 2 may contain a hydrogel. For initiating the releasing from the substrate 1 and the lifting, water may be supplied to the hydrogel-containing layer or layers so that the water is absorbed by the hydrogel-containing layers which leads to an expansion of the hydrogel-containing layers due to the absorbed water and consequently a detachment of the hydrogel-containing layers and thus the whole layer stack 2 from the substrate 1 and a rolling-up process. A similar mechanism may be performed by oxidizing the lower-most layer or layers of the layer stack 2 which in the same way could lead to an expansion of this lower-most layer or layers of the layer stack 2.

In an embodiment in which the layers of the layer stack 2 comprise an inherent vertical stress profile in the as-deposited state, it will be necessary to fix the layer stack 2 to the substrate 1 until the roll-up process is to be initiated. This might be accomplished by providing a first electrically insulating layer 3 with only a low adhesion to the substrate 1. The adhesion between the insulating layer 3 and the substrate 1 should be even large enough to attach the whole layer stack 2 to the substrate 1 against the internal stress which tends to roll-up the layer stack 2. When the roll-up is to be initiated, the adhesion between the insulating layer 3 and the substrate 1 may be released by using, for example, a suitable agent penetrating into the space between the insulating layer 3 and substrate 1 for releasing the attachment between insulating layer 3 and substrate 1 and thus starting the roll-up process of layer stack 2.

It should be noted that the dimensions as shown in FIGS. 3 to 6 are not to scale. In particular, the ratio of layer thickness to the diameter of the rolled-up first portion 2A of layer stack 2 is not correctly scaled. The diameter of the finished capacitor, in particular the diameter of the rolled-up first portion 2A, can be chosen out of a wide range of diameters which can reach from several mm or even cm down to the micrometer or even nanometer scale. Furthermore, the layer stack 2 may be completely disengaged from the substrate 1 after the roll-up procedure and may serve as stand-alone discrete compact device. In this case, the contacting of the electrode layers of the capacitor might be carried out after the capacitor has been disengaged from the substrate 1.

Referring to FIG. 4, there is shown a schematic representation of a further embodiment of a capacitor. In this embodiment before depositing the layer stack 2 a sacrificial layer 1a is deposited onto the substrate 1 and the layer stack 2 is deposited onto the sacrificial layer 1a. The sacrificial layer 1a serves for attachment between the layer stack 2 and the substrate 1 during and after the deposition process. As soon as the roll-up process is to be initiated, the sacrificial layer 1a is removed at a side at which the roll-up is to be started. The sacrificial layer 1a is chosen such that it provides a selectively high etching rate with respect to the other layers when etching with a particular etchant. In FIG. 4 the etchant will be supplied from the right side when the roll-up process of the first portion is to be initiated at the right lateral edge side. The roll-up process can be stopped at any time by stopping the supply of the etchant. In the final state as shown in FIG. 4 the first portion 2A is rolled up and the second portion 2B of the layer stack 2 has the same lateral dimension as the remaining portion of the sacrificial layer 1a.

Referring to FIG. 5, there is shown a schematic representation of a further embodiment of a capacitor. The difference of this embodiment as compared with the embodiment of FIG. 3 lies in the sequence of the layers of the layer stack 12. The layer stack 12 of the embodiment of FIG. 5 comprises a first electrically conducting layer 13, a first electrically insulating layer 14, a second electrically conducting layer 15, and a second electrically insulating layer 16. The first electrically conducting layer 13 serves as a lower electrode layer of the capacitor and the second electrically conducting layer 15 serves as an upper electrode layer of the capacitor. For electrically connecting the electrode layers, two etching steps are necessary. In the first etching step the layers 14, 15 and 16 on the left side are etched away in order to provide place for electrically contacting the first conducting layer 13 with the first electrode terminal 8. In the second etching step the upper-most insulating layer 16 is etched away in order to provide place for contacting the second conducting layer 15 with the electrode terminal 9.

Referring to FIG. 6, there is shown a schematic representation of a further embodiment of a capacitor. As compared with the embodiment as depicted in FIG. 5, the only difference lies in the deposition of the sacrificial layer 1a onto the substrate 1 and the deposition of the layer stack 12 onto the sacrificial layer 1a. The function of the sacrificial layer 1a has been described in detail above, in particular in the description in connection with FIG. 4.

As mentioned above, the capacitors according to the above described embodiments can be fabricated in such a way that a plurality of capacitors can be fabricated in a parallel way. For example, when looking again at FIG. 2, on a substrate 1 a large area layer stack can be deposited covering the whole surface of the substrate 1. Afterwards the large area layer stack can be partitioned into a plurality of layer stacks 2 such as the layer stack 2 shown in FIG. 2. The partitioning can be accomplished by etching away portions of the large area layer stack in order to separate the single layer stacks 2 from each other. Then the rolling process can be initiated in parallel for each one of the layer stacks 2 of the plurality of layer stacks 2, e.g. by etching away a sacrificial layer underneath the layer stacks 2 or by using the other methods as sketched above.

An alternative way to fabricate a plurality of capacitors in parallel is to first pattern the sacrificial layer into many parts and then deposit the layer stack. Afterwards, etching away the sacrificial layer will lead to the formation of capacitors predominantly at those positions of the surface which were covered by the sacrificial layer. In all other parts the layer stack remains fixed to the surface and will not roll-up into a capacitor.

The capacitors described above and those fabricated according to the above described fabrication process can be utilized for many different applications. One possible application is an implementation of an energy storage device. In the state of the art there are known so-called Supercaps or Ultracaps which are basically composed of one or more electrodes surrounded by a conducting liquid. These known devices can reach high values of energy storage capacity but are relatively difficult to fabricate. A capacitor according to the present invention would therefore be an interesting and attractive alternative for use as an energy storage device as it can be fabricated in a very efficient and parallel manner.

The invention claimed is:

1. A capacitor comprising:
   a substrate; and
   a layer stack comprising at least two electrically conducting layers and at least one electrically insulating layer arranged between the two electrically conducting layers, wherein the layer stack comprises two spatially predominant portions, namely
   a first portion of the layer stack which is bent into a direction away from the substrate and is rolled-up and
   a second portion of the layer stack which is planar.

2. The capacitor according to claim 1, wherein the layer stack comprises at least two electrically conducting layers and at least two electrically insulating layers fabricated upon one another in an alternating sequence.

3. The capacitor according to claim 1, wherein at least part of the at least two electrically conducting layers comprises a metal.

4. The capacitor according to claim 1, wherein at least part of a space between the at least two electrically conducting layers is occupied by at least one electrolyte.

5. The capacitor according to claim 1, wherein the second portion of the layer stack is connected to the substrate.

6. The capacitor according to claim 1, further comprising an intermediate layer between the substrate and the second portion of the layer stack.

7. The capacitor according to claim 1, further comprising:
   a first metal contact applied to an exposed region of a first one of the at least two electrically conducting layers; and
   a second metal contact applied to an exposed region of a second one of the at least two electrically conducting layers.

8. The capacitor according to claim 1, wherein at least one layer of the layer stack comprises a vertical stress gradient.

9. The capacitor according to claim 1, wherein at least one layer of the layer stack comprises a hydrogel.

* * * * *